(12) United States Patent
Hirota

(10) Patent No.: US 7,886,248 B2
(45) Date of Patent: Feb. 8, 2011

(54) LAYOUT METHOD OF SEMICONDUCTOR INTEGRATED CIRCUIT AND COMPUTER-READABLE STORAGE MEDIUM STORING LAYOUT PROGRAM THEREOF

(75) Inventor: Katsuhisa Hirota, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 174 days.

(21) Appl. No.: 11/987,861

(22) Filed: Dec. 5, 2007

(65) Prior Publication Data
US 2008/0141208 A1   Jun. 12, 2008

(30) Foreign Application Priority Data
Dec. 6, 2006   (JP) .............................. 2006-329084

(51) Int. Cl.
G06F 17/50 (2006.01)
(52) U.S. Cl. ............................................ 716/14; 716/1
(58) Field of Classification Search ...................... 716/1, 716/12, 14
See application file for complete search history.

(56) References Cited

U.S. PATENT DOCUMENTS

| | | | |
|---|---|---|---|
| 5,798,937 A | 8/1998 | Bracha et al. | |
| 6,829,757 B1 * | 12/2004 | Teig et al. ..................... 716/12 |
| 2002/0147951 A1 * | 10/2002 | Nadeau-Dostie et al. .... 714/731 |
| 2003/0084417 A1 * | 5/2003 | Baba ........................... 716/10 |
| 2006/0064653 A1 * | 3/2006 | Zhang et al. ................... 716/2 |
| 2006/0101367 A1 * | 5/2006 | Fujita et al. ................... 716/10 |
| 2008/0189667 A1 * | 8/2008 | Pikus et al. .................... 716/5 |
| 2008/0244499 A1 * | 10/2008 | Hanamitsu ................... 716/15 |

FOREIGN PATENT DOCUMENTS

| | | |
|---|---|---|
| JP | 2005-26390 | 1/2005 |
| JP | 2006-65403 | 3/2006 |
| JP | 2006-135152 | 5/2006 |

* cited by examiner

*Primary Examiner*—Jack Chiang
*Assistant Examiner*—Suchin Parihar
(74) *Attorney, Agent, or Firm*—McGinn Intellectual Property Law Group, PLLC

(57) ABSTRACT

The present invention is a method that a redundant via is never added afterwards for a signal wiring or a clock wiring, but layout is performed using a multi-cut via from the beginning, which is used for laying out a semiconductor integrated circuit by a step (S32) of searching a wiring route that layout is possible using a multi-cut via regarding a net in a net list, a step (S33) of laying out a wiring corresponding to the net on the wiring route with using the multi-cut via, and a step (S70) of creating layout data of the semiconductor integrated circuit by repeating the steps S32 and S33.

24 Claims, 11 Drawing Sheets

TOGGLE RATE FILE

| ORDER | NET NAME | TOGGLE RATE |
|---|---|---|
| 1 | AAA | 0.45 |
| 2 | BBB | 0.39 |
| 3 | CCC | 0.21 |
| ⋮ | ⋮ | ⋮ |
| N | XXX | 0.01 |

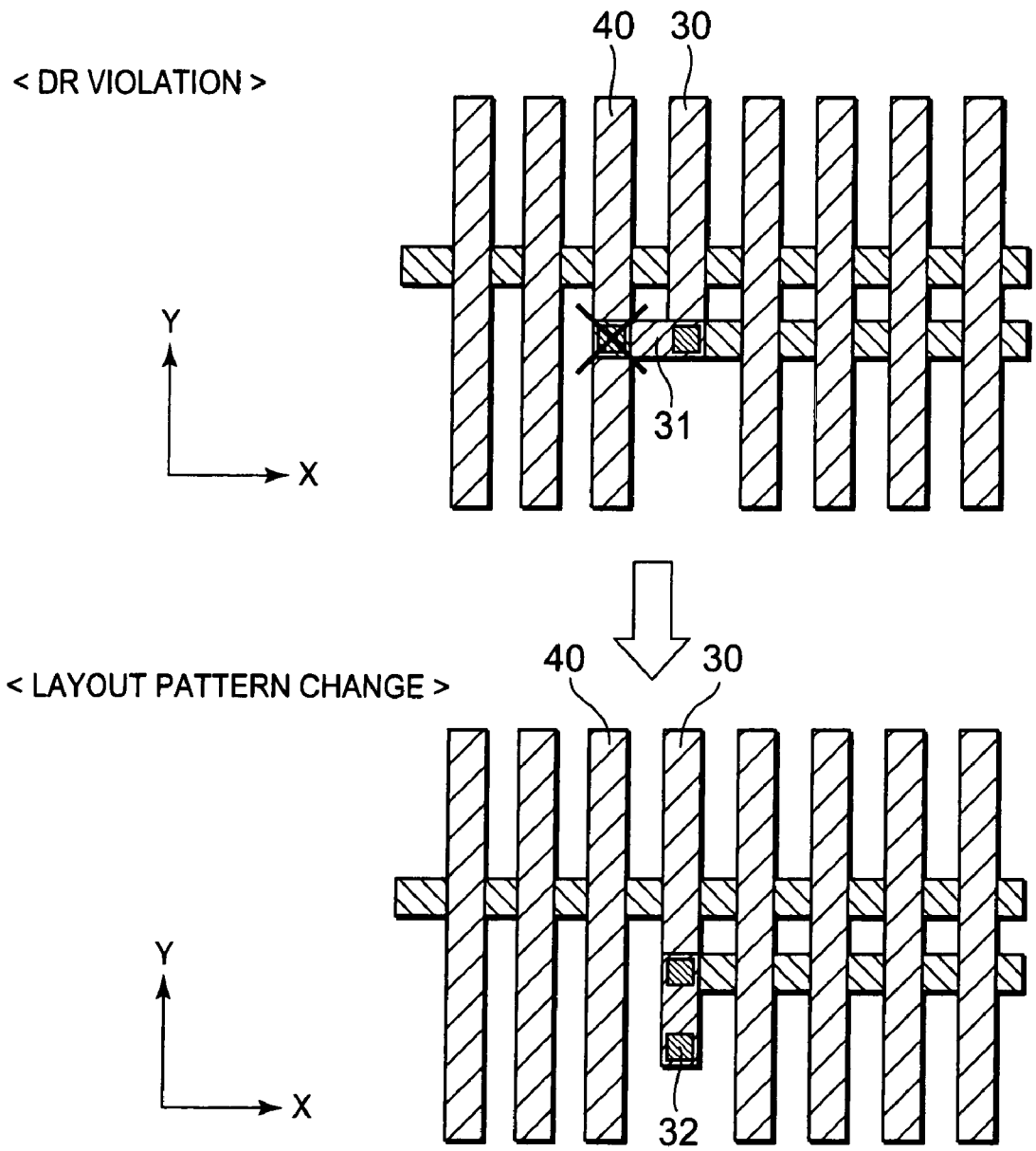

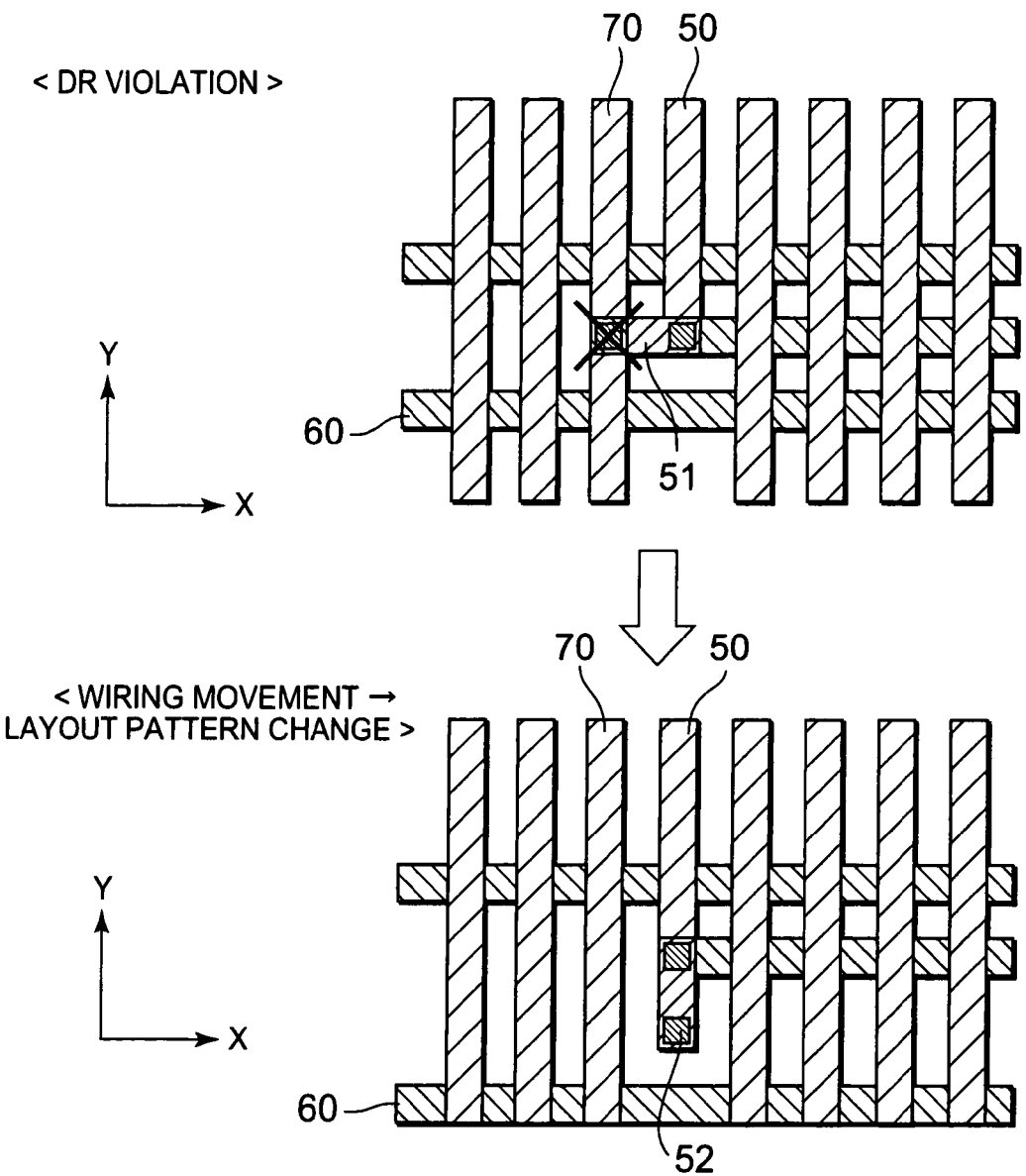

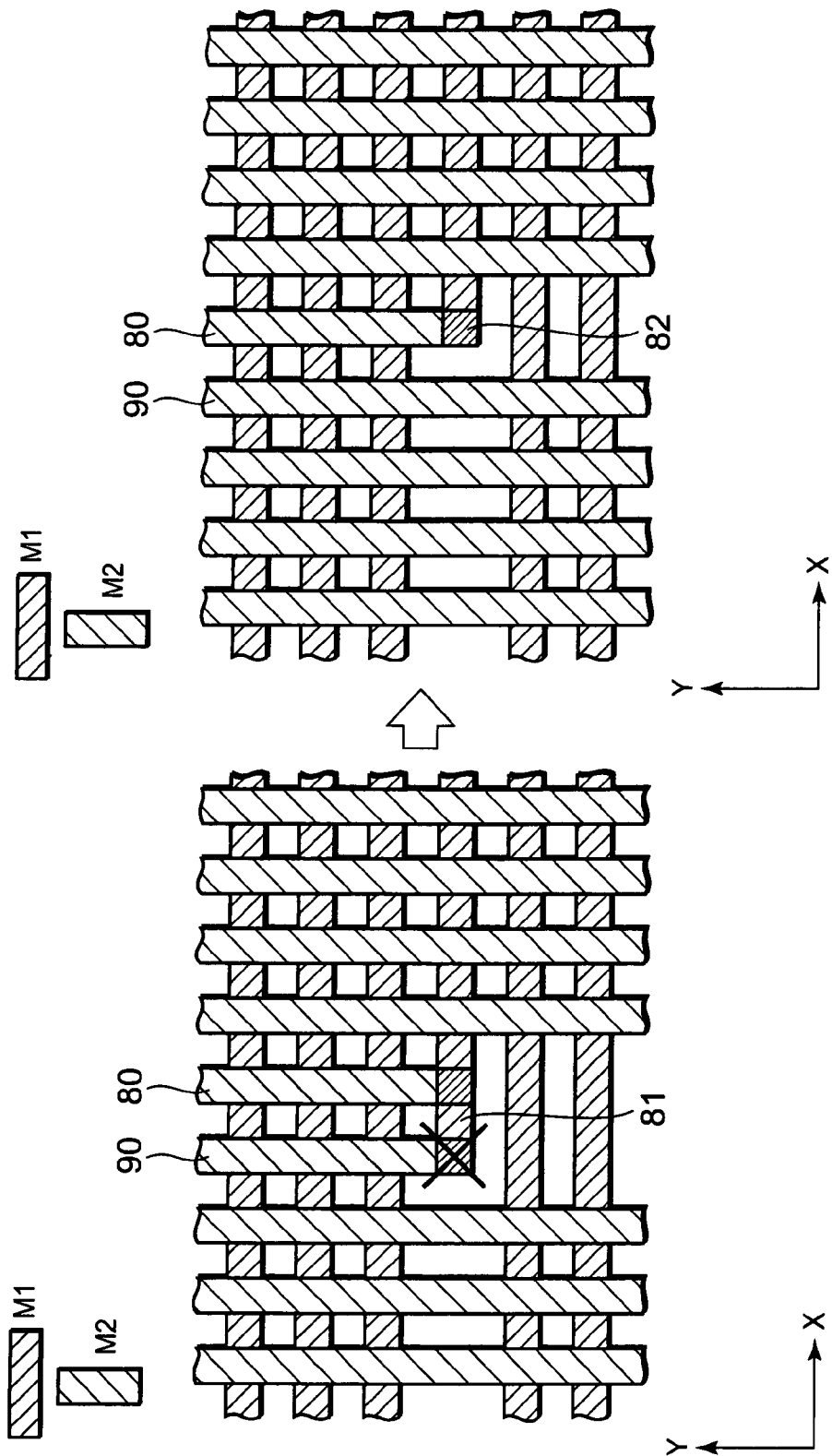

LAYOUT METHOD OF SEMICONDUCTOR INTEGRATED CIRCUIT AND COMPUTER-READABLE STORAGE MEDIUM STORING LAYOUT PROGRAM THEREOF

FIELD OF THE INVENTION

The present invention relates to a layout technique of a semiconductor integrated circuit. In particular, the present invention relates to a layout technique of a semiconductor integrated circuit using a multi-cut-via.

BACKGROUND OF THE INVENTION

In a semiconductor integrated circuit which has a multi-layer wiring layer, in order to connect a certain wiring layer and another wiring layer mutually, via structure is used. Generally, in a signal wiring except a power supply wiring, connection between different wiring layers by using one via per location is made. Hereafter, such a general via is referred to a "single-cut via."

With following miniaturization of semiconductor integrated circuits in recent years, wiring width has been reduced, and an area of a single-cut via has been also small. Hence, it has become hard at the time of a production process to form a single-cut via with a desired pattern. In a worst case, an open fault arises in a via-forming section, and a desired device operation is no longer achieved. This causes a drop of a yield. Furthermore, with following shrinkage of a single-cut via, a delay time in signal wiring becomes large, and a disconnection probability by electromigration also becomes high. These cause a drop of operational reliability of a device.

As a technique for suppressing such a malfunction, "redundant vias" are proposed as described, for example, in U.S. Pat. No. 5,798,937 and the like. According to the redundant via technique, in addition to an original single-cut via, a "redundant via" is provided. In further detail, redundant via software extracts a single-cut via from layout data after a detail routing step. Then, the redundant via software places a redundant via in parallel around the extracted single-cut via. Then, design rules are checked. When there is no violation, the redundant via is adopted, and in the case of a violation, the redundant via is eliminated. In this way, a redundant via is added to at least a part of a signal wiring of a design object circuit. In this case, even if a defect arises in any one of the original via and redundant via, electrical connection of the signal wiring is secured. In consequence, an event probability of the above-described malfunction is reduced.

The followings are known as latest techniques relevant to formation of a redundant via.

According to a technique described in Japanese Patent Laid-Open No. 2005-26390, a timing analysis is performed using layout data. Then, it is judged whether a delay time of a signal fulfills a predetermined reference value. When the predetermined reference value is not fulfilled, a redundant via is added for the number of via cuts to be increased so that the reference value may be fulfilled.

According to a technique described in Japanese Patent Laid-Open No. 2006-135152, an error analysis is performed for layout data to which a redundant via is added, and presence of an antenna effect error or a timing constraint violation is judged. When an error exists, redundant via structure is restored to a single-cut via so that the error may be dissolved.

According to a technique described in Japanese Patent Laid-Open No. 2006-65403, in order to enhance a substitutional rate to redundant via structure (multi-cut via), formation of a redundant via is performed during a wiring design. Specifically, wiring cost, via cost, and obstruction cost are defined, and a wiring route that cost becomes at minimum is searched. Then, wiring is laid out and single-cut vias are placed (refer to FIG. 8 in the document concerned). Furthermore, the single-cut vias are substituted by multi-cut vias (refer to FIG. 9 in the document concerned).

As a result of investigating the above-mentioned conventional technology, the present inventor paid attention to the following point. According to the above-described conventional technology, "formation of a redundant via" is performed, that is, an original single-cut via is converted into redundant via structural after the single-cut via is placed. Here, a case as shown in FIG. 1 is considered. FIG. 1 shows a state that a wiring 1 is laid out with ranging over the wiring layers M1 and M2, and a single-cut via 2 is placed in order to connect the wiring layers M1 and M2. At this time, another wiring is laid out on the wiring layer M1 or M2 around the single-cut via 2. Therefore, since a space for substituting the single-cut via 2 to redundant via structural does not exist, formation of a redundant via is impossible regarding the wiring 1. In this way, according to the conventional technology, it was not possible to achieve the formation of a redundant via depending on a surrounding wiring situation.

SUMMARY

The present invention seeks to solve one or more of the above problems, or to improve upon those problems at least in part.

According to one embodiment of the present invention, a layout method of a semiconductor integrated circuit is provided. The layout method has steps of (A) searching an available wiring route for a multi-cut via regarding a certain net in a net list, (B) laying out a wiring of the net concerned on the above-mentioned wiring route with using the multi-cut via, and (C) creating layout data which shows a layout of the semiconductor integrated circuit by repeating the above-described steps (A) and (B).

In addition, according to the embodiment of the present invention, a recording medium which records a computer program which makes a computer automatically execute the above-mentioned layout method is provided.

Here, a multi-cut via means two or more vias for connecting different wiring layers in certain positions on a certain wiring. In short, when a multi-cut via is used for wiring laid out with ranging over different wiring layers, two or more vias are placed in a transition region between these wiring layers.

According to the embodiment of the present invention, in the detail routing processing before layout data completion, a wiring route where a multi-cut via can be used is searched from the beginning. Thus, layout is performed not using a single-cut via but using a multi-cut via from the beginning. That is, "formation of a redundant via" is not performed. Hence, it is possible to prevent a situation that formation of a redundant via is unrealizable depending on a surrounding wiring situation. In consequence, a usage rate of a multi-cut via improves, and a yield and operational reliability improve.

According to the embodiment of the present invention, the usage rate of a multi-cut via improves. In consequence, the yield and operational reliability of a semiconductor integrated circuit improve.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 9 is a top view showing an example of change processing of a layout pattern of a multi-cut via in the embodiment of the present invention;

FIG. 10 is a top view showing another example of change processing of a layout pattern of a multi-cut via in the embodiment of the present invention;

FIG. 11 is a top view showing an example of change processing of a multi-cut via to a single-cut via in the embodiment of the present invention.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

The computer program code and data structures described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile disk), and semiconductor memory devices.

Hereafter, with reference to drawings, layout processing of a semiconductor integrated circuit in an embodiment of the present invention will be described.

1. Layout Processing System

Figure 1:
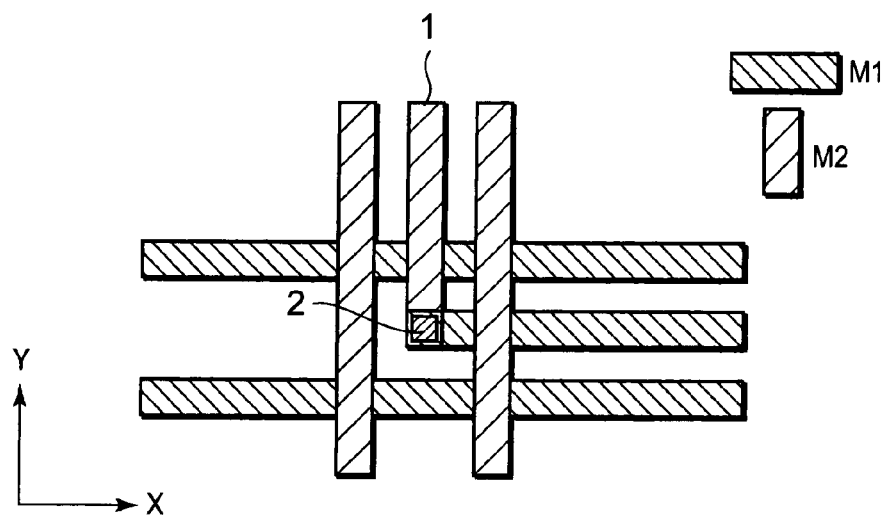
FIG. 1 shows a top view of a layout result by conventional redundant vias layout method.
Figure 2:
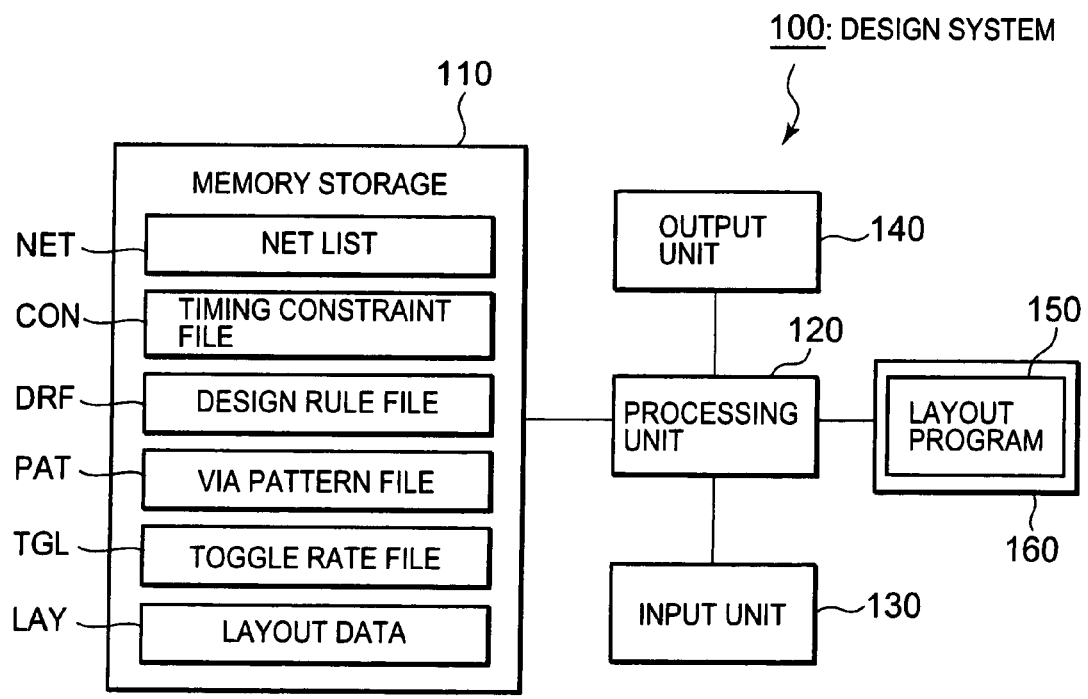
FIG. 2 is a block diagram showing construction of a design system of a semiconductor integrated circuit in an embodiment of the present invention.

The layout processing in this embodiment is feasible using a computer. FIG. 2 is a block diagram showing construction of a design system 100 (CAD system) which performs layout processing of this embodiment. This design system 100 is equipped with a memory storage 110, a processing unit 120, an input unit 130, an output unit 140, and a program storage 160 that stores a layout program 150.

RAM or an HDD exemplifies the memory storage 110. This memory storage 110 stores a net list NET, a timing constraint file CON, a design rule file DRF, a via pattern file PAT, a toggle rate file TGL, layout data LAY, and the like. The net list NET shows connecting relation (net) between cells in a design object circuit. The timing constraint file CON shows timing constraints (setup constraint and hold constraint) regarding a design object circuit. The design rule file DRF shows a design standard (design rules). These of net list, NET, timing constraint file CON, and design rule file DRF are files used also in general layout processing. On the other hand, the via pattern file PAT and toggle rate file TGL are files peculiar to this embodiment, and their detail will be mentioned later.

The layout program 150 is stored in the program storage 160. RAM or an HDD exemplifies the program storage 160. The above-mentioned memory storage 110 and program storage 160 may be a common memory storage, and in that case, an area where data are stored becomes the memory storage 110 and an area where a program is stored becomes the program storage 160. Usually, the layout program 150 is installed in a computer-readable medium, such as a CD or a DVD, or in the program storage 160 from the external of the design system 100 through a communication line. This layout program 150 is software read and executed by the processing unit 120, and provides the below-mentioned layout processing function. The processing unit 120 reads data and a file, which are necessary, from the memory storage 110 according to an instruction of the layout program 150, and stores in the memory storage 110 the data and file which are created. The layout program 150 which is software achieves the below-mentioned layout processing with collaborating with hardware resources, such as the memory storage 110 and processing unit 120.

A keyboard and a mouse exemplify the input unit 130. A user can perform edit of a file and an input of a command by using the input unit 130. A display unit exemplifies the output unit 140. A user can refer to design information, such as a layout displayed on the display unit.

2. Processing Flow

Figure 3:
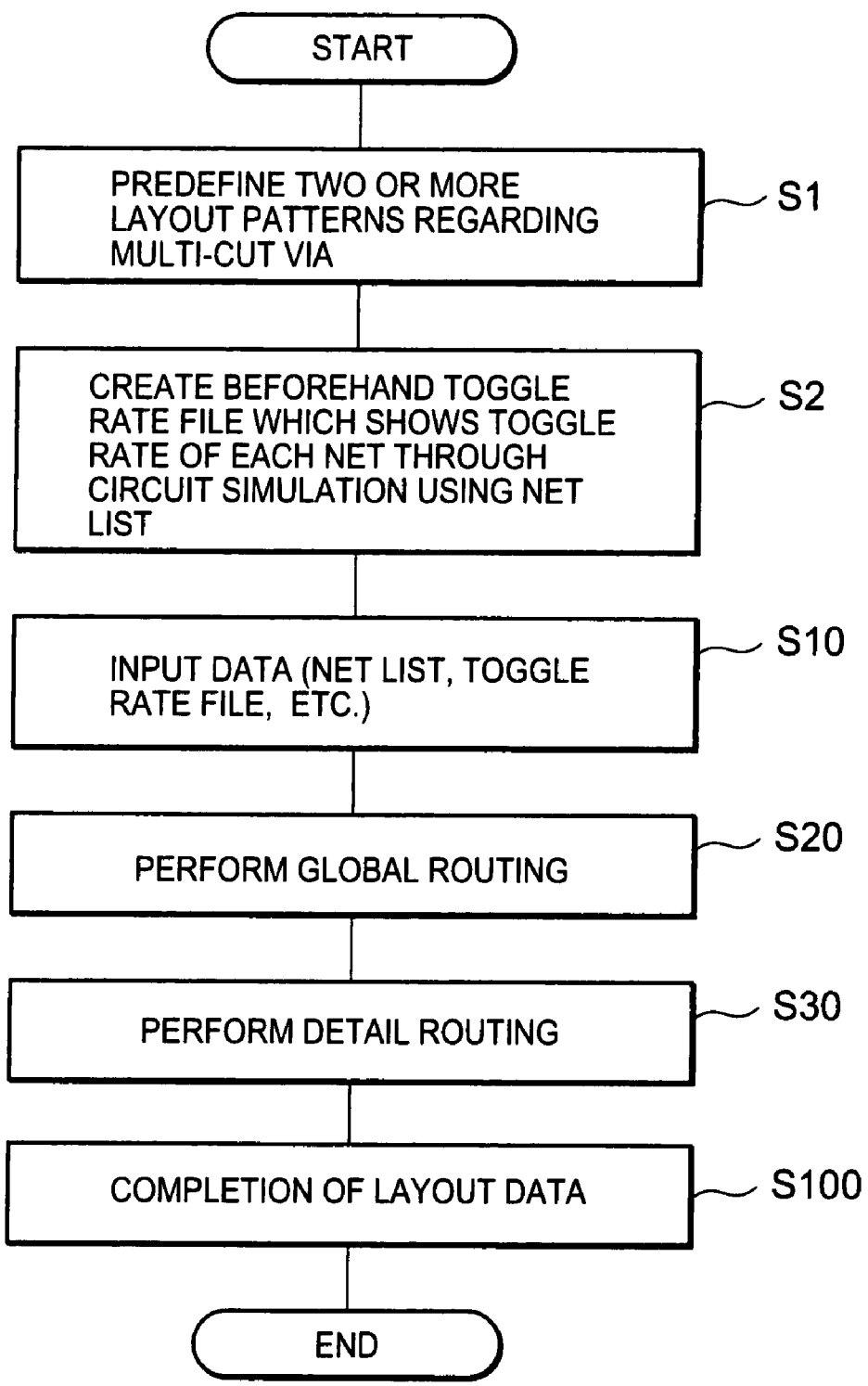
FIG. 3 is a flowchart showing a layout method of a semiconductor integrated circuit in the embodiment of the present invention.
Figure 4:
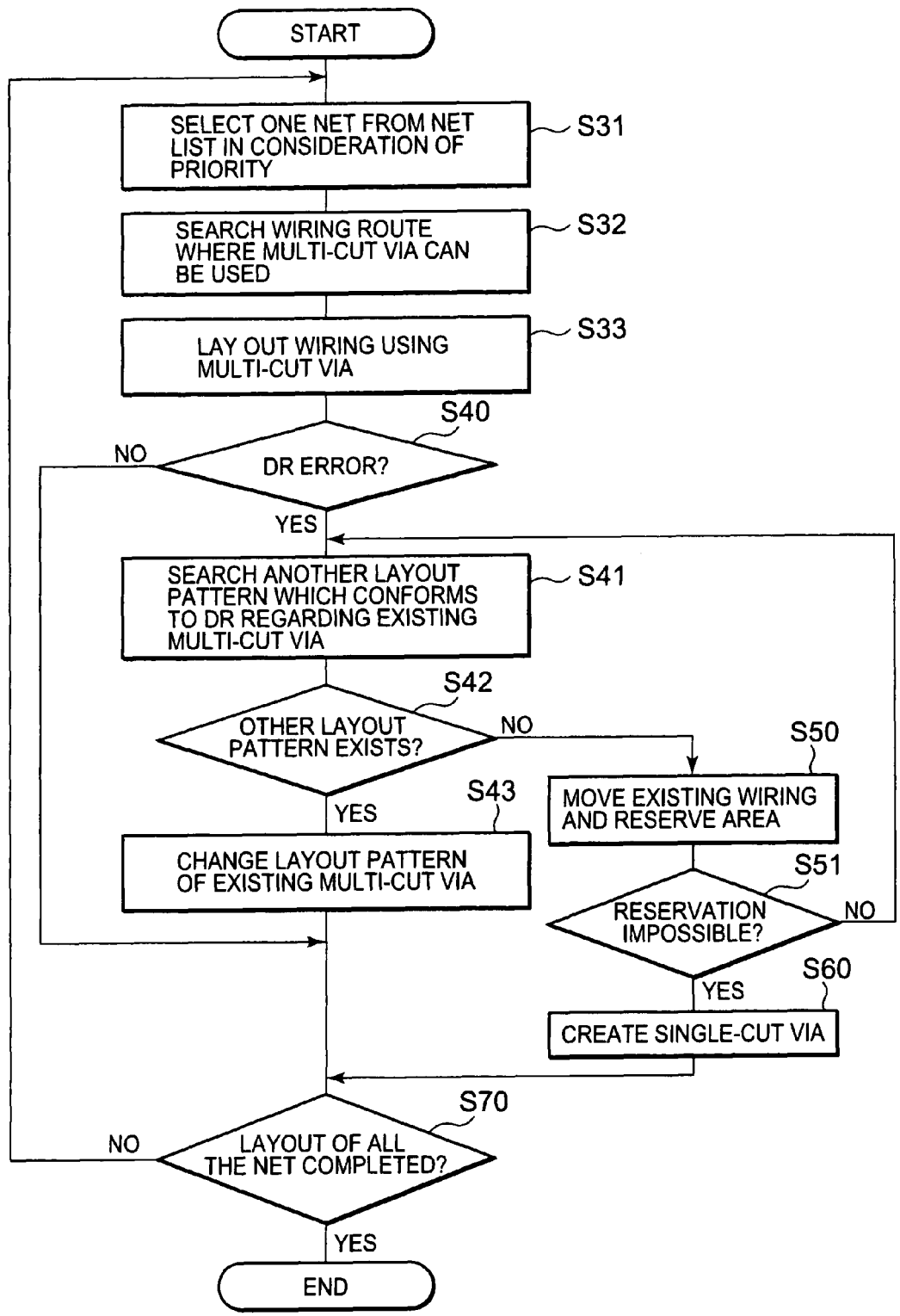
FIG. 4 is a flowchart showing detail routing processing in the embodiment of the present invention.

FIGS. 3 and 4 are flowcharts showing a layout method of a semiconductor integrated circuit in this embodiment. A layout processing flow in this embodiment will be described in detail with referring to FIGS. 3 and 4.

In addition, in this specification, a "single-cut via" is defined as a single via, when wirings on different wiring layers are connected with the single via. On the other hand, a "multi-cut via" is defined as two or more vias, when wirings on different wiring layers are connected with the two or more vias placed in parallel. In short, when a multi-cut via is used for a wiring laid out with ranging over different wiring layers, two or more vias are placed in parallel between those wiring layers. In addition, usually, two or more vias which construct a multi-cut via are placed adjacently each other.

Step S1: Creation of Via Pattern File

As described later in detail, in the layout processing in this embodiment, a multi-cut via is fundamentally used for connection between wirings of different wiring layers. That is, a redundant via is never added after a single-cut via has been placed, but a multi-cut via is placed from the beginning. For that purpose, two or more layout patterns are predefined regarding a multi-cut via.

Figures 5, 6:
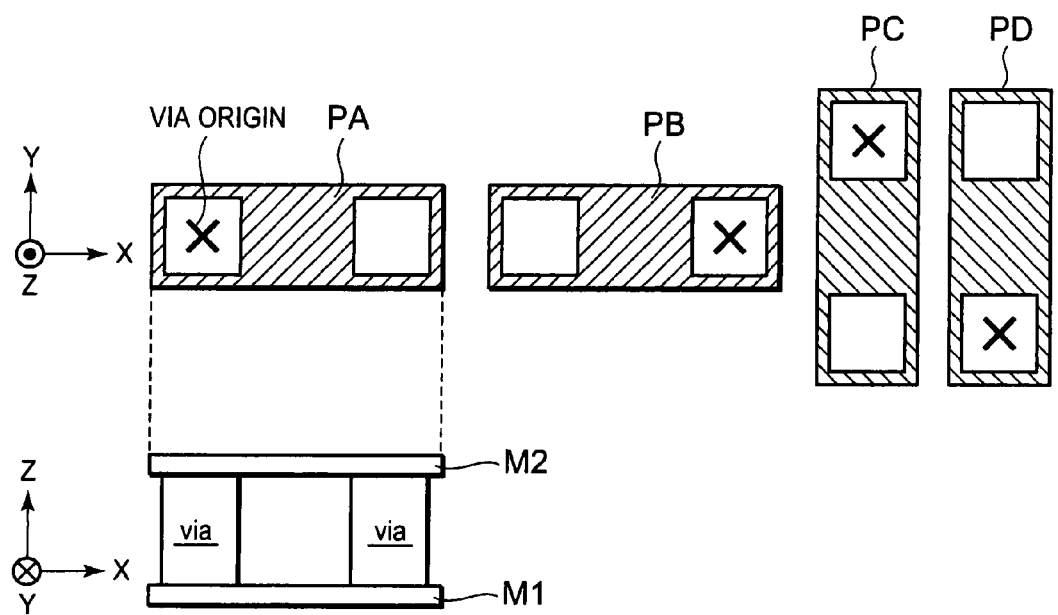
FIG. 5 is a schematic diagram showing two or more layout patterns of a multi-cut-via used in the embodiment of the present invention.
FIG. 6 shows a table showing an example of a toggle rate file used in the embodiment of the present invention.

FIG. 5 shows conceptually two or more layout patterns PA to PD of multi-cut vias. The multi-cut via shown in FIG. 5 is a double-cut via in which two vias are placed in order to connect a lower wiring layer M1 and an upper wiring layer M2. A center of any one of two vias becomes a via origin (expressed by an x mark). At a detail routing step, each multi-cut via is placed so that this via origin may take a grid point. In the layout patterns PA and PB, two vias are placed in parallel along an X direction. On the other hand, in the layout patterns PC and PD, two vias are placed in parallel along a Y direction. The X direction is a priority wiring direction (non-priority wiring direction in the upper wiring M2) in the lower wiring layer M1, and the Y direction is a priority wiring direction (non-priority wiring direction in the lower layer wiring M1) in the upper wiring layer M2.

The via pattern file PAT which defines such two or more layout patterns PA to PD is beforehand created by a user. The created via pattern file PAT is stored in the memory storage 110.

Step S2: Creation of Toggle Rate File

As described in detail later, in the layout processing in this embodiment, the toggle rate of a wiring is noted. For that purpose, the toggle rate file TGL which shows each toggle rate of a wiring is created beforehand. The toggle rate is calculable through a circuit simulation, for example. Specifically, a net list NET and a predetermined test pattern are inputted into a circuit simulator. The circuit simulator executes an operation simulation of the design object circuit which the net list NET shows. On the basis of consequence of the operation simulation, a toggle rate regarding each net in the net list NET can be obtained.

FIG. 6 shows an example of the toggle rate file TGL. Each entry of the toggle rate file TGL includes order, a net name, and a toggle rate. The net name matches a net name used in the net list NET. The order is determined on the basis of magnitude of the toggle rate, and each entry is sorted on the basis of the toggle rate. For example, the order of the net "AAA" associated with the toggle rate "0.45" is the first place. In addition, the order of the net "BBB" associated with the toggle rate "0.39" is the second place.

In this way, the toggle rate file TGL shows each toggle rate of a part or all of nets in the net list NET. A toggle rate is a number of wiring logic transiting per unit time. Therefore, in wiring with a high toggle rate, the number of the logic transiting per unit time is large, and a current which flows through the wiring also increases, and hence, it is easy to generate electromigration. Therefore, it is desirable to apply a multi-cut via preferentially in particular to the wiring with a high toggle rate. By using a multi-cut via, it is possible to reduce a current amount per via and to prevent the generation of electromigration. Furthermore, even if one via out of two or more vias is disconnected by electromigration, another via can prevent a malfunction. It can be said that the toggle rate file TGL is a priority file which shows a priority. The created toggle rate file TGL is stored in the memory storage 110.

Step S10: Data Input

The processing unit 120 executes the layout program 150. Thereby, the layout processing by this embodiment is started. First, the processing unit 120 reads the net list NET, timing constraint file CON, design rule file DRF, via pattern file PAT, toggle rate file TGL, and the like from the memory storage 110.

Step S20: Global Routing

Global routing is performed after special routing and a cell layout are completed. Assignment of global wiring and the like are determined in the global routing. Specifically, a layout area is classified into two or more unit areas, and, the number of wirings, laid out in each unit area, and the like are estimated.

Step S30: Detail Routing

In detail routing, routing between cells and layout of a via are actually performed. The detail routing in this embodiment has the following features.

(1) From a first phase of layout, the layout is performed using a multi-cut via without using a single via. Hence, a step of substituting a single via by a multi-cut via is unnecessary.

(2) A priority of the routing laid out is considered.

Figure 7:
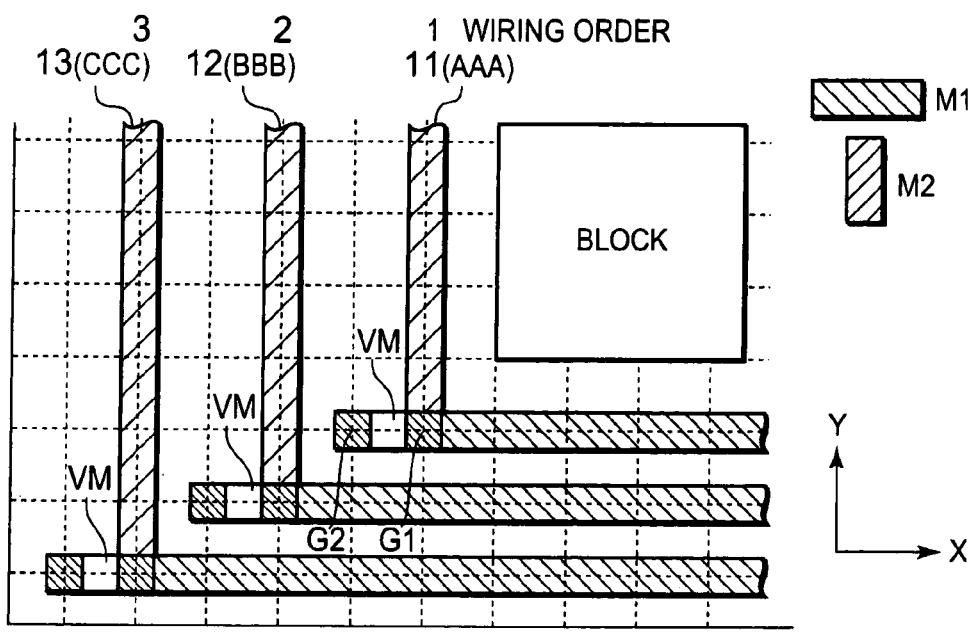
FIG. 7 is a top view showing an outline example of the detail routing processing in the embodiment of the present invention.

An example of the detail routing in this embodiment is shown in FIG. 7. Broken lines in the diagram express wiring grids, and their intersection points are grid points. In FIG. 7, wirings 11, 12, and 13 corresponding to nets "AAA", "BBB" and "CCC" respectively are laid out along with the wiring grids. In addition, a multi-cut via VM is placed with corresponding to a turnoff point (grid point G1) on each wiring. Specifically, the above-described via origin gets on the grid point G1, and a center of another via gets on an adjacent grid point G2.

One standard of a priority of a wiring laid out is a toggle rate shown in the above-described toggle rate file TGL. For example, in order from a net with a high toggle rate, a wiring layout is performed using a multi-cut via.

In the toggle rate file TGL shown in FIG. 6, the toggle rate of the net "AAA" is higher than that of the net 1Q "BBB", and the toggle rate of the net "BBB" is higher than that of the net "CCC." Hence, in the example shown in FIG. 7, the wiring 11 corresponding to the net "AAA" is laid out before the wiring 12 corresponding to the net "BBB" and the wiring 12 is laid out before the wiring 13 corresponding to the net "CCC." In this way, a wiring with a high toggle rate in a design object circuit is laid out before a wiring with a low toggle rate. In consequence, a multi-cut via is securely applied to a wiring with a high toggle rate.

Hereafter, the detail routing in this embodiment will be described in more detail with referring to a flowchart shown in FIG. 4.

Step S31:

First, one net of a layout object is selected from all the nets shown in the net list NET. A priority is taken into consideration in the selection. For example, when there is an important wiring in which a defect's generation should be suppressed in particular, a priority of the wiring is high. Hence, the net corresponding to the wiring is selected preferentially. One standard of the priority is a toggle rate. As already described, it is because it is easy in a wiring with a high toggle rate to generate electromigration.

A clock wiring and signal wirings except the clock wiring are included in the design object circuit. The signal wirings include data wiring and a control signal wiring. In addition, in the signal wirings, a signal wiring which constructs a critical path which becomes a neck of working speed of the design object circuit, that is, a critical wiring is included. A priority of the wiring in this case is as follows, for example.

1. Clock wiring
2. Critical wiring
3. Remaining signal wirings

In addition, since wirings which supply fixed potentials, such as a power supply wiring and a ground wiring, are not signal wirings, they may be routed before the clock wiring.

It can be said that the clock wiring is a wiring with a highest toggle rate. Hence, a net (clock net) corresponding to the clock wiring is selected first. The clock net can be recognized from the net list NET. In addition, the clock wiring may include a high-speed clock wiring and a low speed clock wiring. In that case, since a toggle rate of the net (high-speed clock net) corresponding to the high-speed clock wiring becomes higher than that of the net (low-speed clock net) corresponding to the low speed clock wiring, the former net is selected ahead. The high-speed clock net and low-speed clock net are distinguishable on the basis of a clock frequency.

The critical wiring is an important wiring from an aspect of a timing constraint although a toggle rate is not related. In order to reduce via resistance in the critical wiring and to prevent increase of delay, a multi-cut via should be applied securely. Hence, the net (critical net) corresponding to the critical wiring is selected next to the clock net. The critical net can be recognized on the basis of the net list NET and timing constraint file CON.

Subsequently, nets corresponding to other signal wirings are selected. It is preferable to take a priority into consideration also here. That is, according to the priority shown by the above-described toggle rate file TGL, they are selected in order from a net with a high toggle rate. It is sufficient that toggle rates of the signal wirings except the clock wiring are described in the toggle rate file TGL. In this way, they are selected in order from a net of a wiring with a high priority by referring to the net list NET, timing constraint file CON, and toggle rate file TGL.

Step S32:

A wiring is laid out regarding the selected net (hereafter referred to an "object net"). First of all, a search of a wiring route on which the wiring is placed is performed. For example, a shortest route is searched in a range of not violating design rules. A via is placed in a turnoff point (transition region between the lower wiring layer M1 and upper wiring layer M2) on the searched wiring route. In this embodiment, use of a multi-cut via is a premise. Hence, the via pattern file PAT is referred to and one layout pattern which conforms to the design rules is selected from two or more layout patterns (refer to FIG. 5) defined.

In further detail, a reference grid point (refer to G1 in FIG. 7) which is a turnoff point on the wiring route is first noted. Then, two or more layout patterns are applied in order to the reference grid point. At this time, a grid point adjacent to the reference grid point is checked according to each layout pattern. When a certain adjacent grid point is available in both the lower wiring layer M1 and upper wiring layer M2, the adjacent grid point is reserved. In this way, a surrounding wiring situation is taken into consideration and a suitable layout pattern is selected from the two or more layout patterns. When there is no suitable layout pattern, another wiring route is searched. In this way, on the object net, a wiring route on which a multi-cut via is available is determined.

Figure 8A:
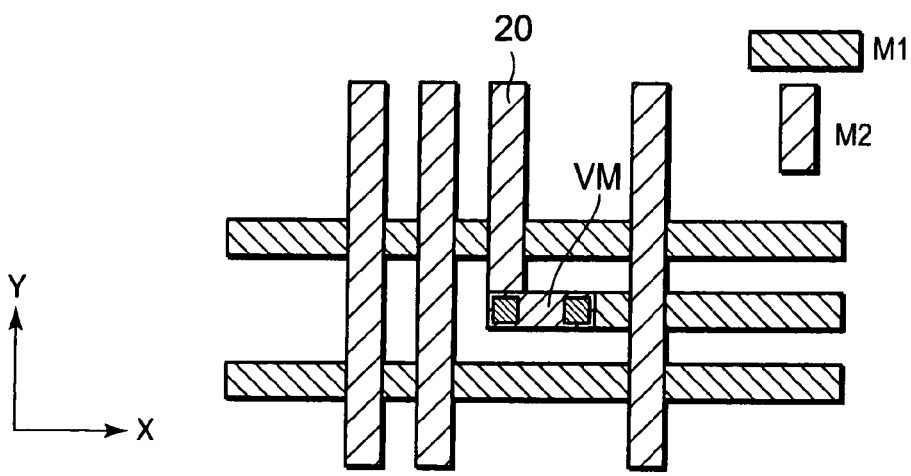
FIG. 8A is a top view showing an example of a layout of a multi-cut via in the embodiment of the present invention.
Figure 8B:
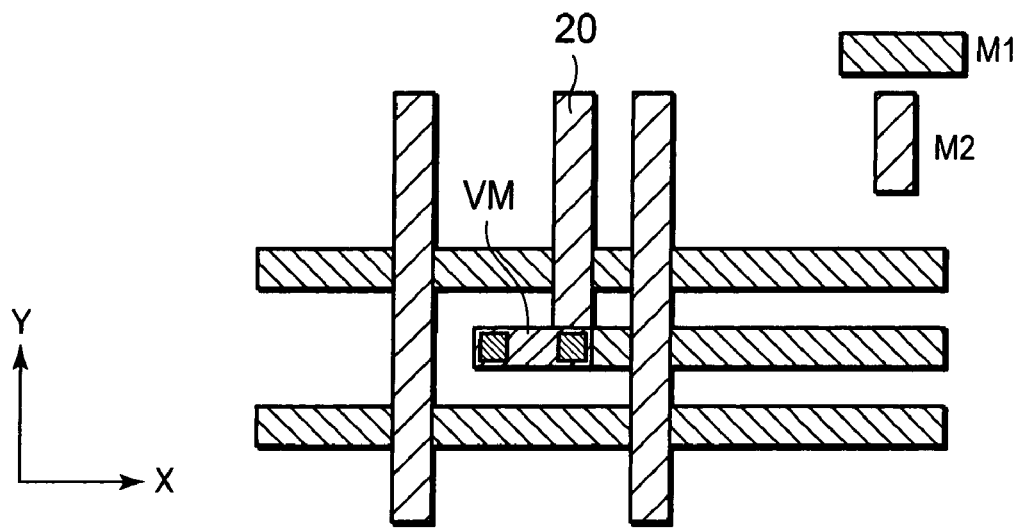
FIG. 8B is a top view showing another example of a layout of a multi-cut via in the embodiment of the present invention.
Figure 8C:
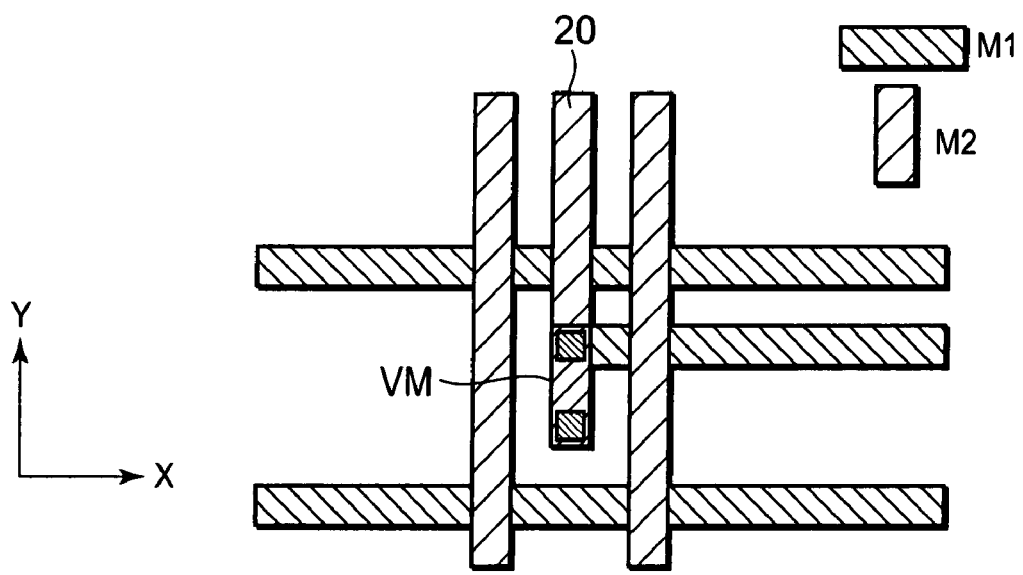
FIG. 8C is a top view showing still another example of a layout of a multi-cut via in the embodiment of the present invention.
Figure 8D:
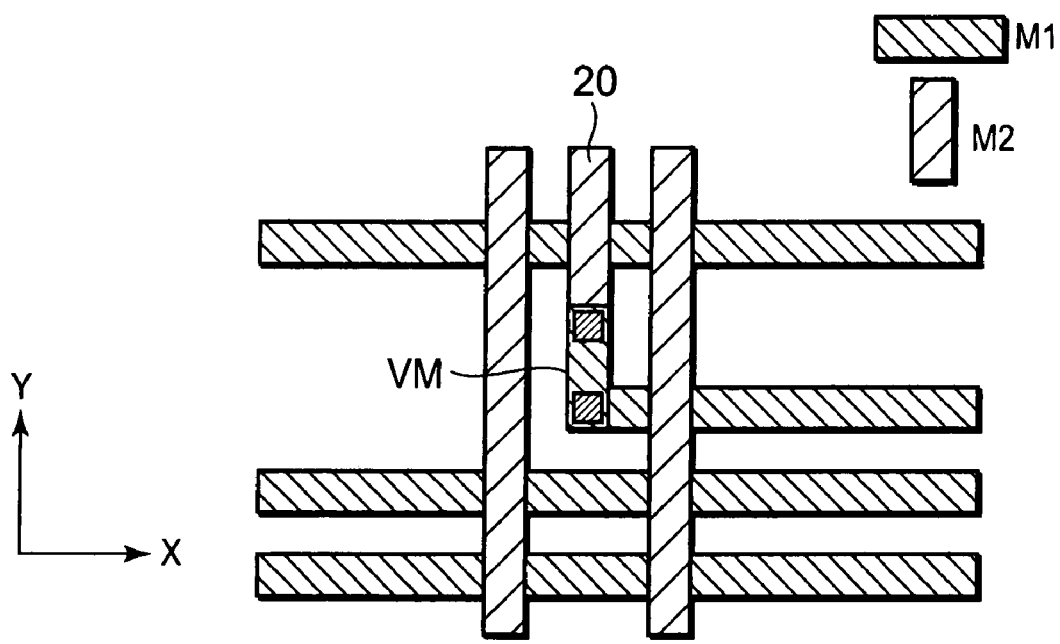
FIG. 8D is a top view showing a further example of a layout of a multi-cut via in the embodiment of the present invention.

Step S33:

The wiring of the object net is laid out on the determined wiring route. In addition, a multi-cut via of the selected layout pattern is placed. FIGS. 8A to 8D show various examples of the wiring layout. In each drawing, a wiring 20 is a wiring (new wiring) under current processing. In FIG. 8A, a multi-cut via VM of a layout pattern PA (refer to FIG. 5) is used. In FIG. 8B, a multi-cut via VM of a layout pattern PB is used. In FIG. 8C, a multi-cut via VM of a layout pattern PC is used. In FIG. 8D, a multi-cut via VM of a layout pattern PD is used. In each example, it turns out that an optimum layout pattern is selected according to a surrounding wiring situation.

As described above, according to this embodiment, a wiring of an object net is laid out using a multi-cut via.

Steps S40 to S43:

When wiring processing advances, a design rule error may arise between a wiring of the object net, and a-multi-cut via (hereafter referred to an "existing multi-cut via") already placed (step S40; Yes). Processing in that case will be described with reference to FIG. 9.

In FIG. 9, a wiring 30 is already laid out. In addition, a multi-cut via 31 is already placed to the wiring 30. A new wiring 40 is laid out in this state. Suppose that the new wiring 40 overlaps with the existing multi-cut via 31. In this case, another layout pattern which conforms to design rules is searched regarding the existing multi-cut via 31 (step S41). In an example shown in FIG. 9, an overlap with the new wiring 40 is dissolved by changing a direction of the existing multi-cut via 31 (step S42; Yes). Hence, the layout pattern of the existing multi-cut via 31 is changed (step S43). Specifically, as shown in FIG. 9, the existing multi-cut via 31 is removed and, a multi-cut via 32 which conforms to the design rules is newly placed.

Steps S50 and S51:

At the above-mentioned step S41, a case that another layout pattern which conforms to the design rules do not exist is conceivable (step S42; No). Thus, a case that, even if any layout pattern defined is used, a design rule error is not dissolved is conceivable. Processing in that case will be described with reference to FIG. 10.

In FIG. 10, wirings 50 and 60 are already laid out. In addition, a multi-cut via 51 is already placed to the wiring 50. A new wiring 70 is laid out in this state. Suppose that the new wiring 70 overlaps with the existing multi-cut via 51. At this time, since the existing multi-cut via 51 is surrounded by other existing wirings, it is not possible to change the layout pattern of the existing multi-cut via 51. Therefore, in order to reserve a space around the existing multi-cut via 51, some of existing wirings are moved (step S50). Here, it is necessary to reserve the space to such an extent that the layout pattern of the existing multi-cut via 51 can be changed. In the case of an example shown in FIG. 10, by moving an existing wiring 60, it is possible to reserve a suitable space SP around the existing multi-cut via 51 (step S51; No). Therefore, it is possible to change the layout pattern of the existing multi-cut via 51 by using the space SP reserved (steps S41 to S43). Specifically, as shown in FIG. 10, the existing multi-cut via 51 is removed and, a multi-cut via 52 which conforms to the design rules is newly placed.

In this way, the space SP which is sufficient for dissolution of a design rule error is reserved at step S50 by moving some of existing wirings. Movement of the existing wirings is executed only within the unit area defined at the time of the above-described global routing. Thus, an influence does not extend to other unit areas. In addition, in the moving processing, it is desirable to keep an optimum wiring route regarding the important existing wirings. For example, it is desirable that movement of the clock wiring is forbidden so that a clock tree may be not disturbed. Hence, the above-described priority is taken into consideration, and, if possible, the space SP is reserved by movement of an existing wiring with a low toggle rate. For example, wirings are moved in order of from an existing wiring with a low toggle rate until the space SP is reserved.

Step S60:

In the above-mentioned step S50, a case that a sufficient space SP can be never reserved is conceivable (step S51; No). Processing in that case will be described with reference to FIG. 11.

In FIG. 11, a wiring 80 is already laid out. In addition, a multi-cut via 81 is already placed to the wiring 80. A new wiring 90 is laid out in this state. Suppose that the new wiring 90 overlaps with the existing multi-cut via 81. In addition, suppose that, even if the existing wiring is moved, a sufficient space for dissolution of a design rule error is not reserved. In this case, as shown in FIG. 11, the existing multi-cut via 81 is changed into a single-cut via 82. Thus, the existing multi-cut via 81 is removed and the single-cut via 82 is newly placed (step S60).

The above-described priority may be taken into consideration also at this step S60. For example, suppose that two kinds of wiring routes can be considered regarding the new wiring 90. Then, suppose that the new wiring 90 overlaps with a certain existing multi-cut via in any case. In that case, the existing multi-cut via of an existing wiring with a lower priority (toggle rate) is changed into a single-cut via.

Step S70:

When a net which is not laid out still exists (step S70; No), processing returns to step S31 and the following object net is selected. Then, the above-described processing is repeated regarding all the nets in the net list NET. According to this embodiment, the clock wiring is laid out before the critical wiring. In addition, the critical wiring is laid out before other signal wirings. The signal wirings are laid out in order from what has a high toggle rate. When a layout is completed regarding all the nets (step S70; Yes), processing advances to step S100.

In addition, the above-described processing may be repeated by the predetermined number of times. Thus, the multi-cut via may be applied only to part of nets in the net list NET. Even in such a case, since the multi-cut via is applied to at least a wiring with a high priority, the excellent effect is obtained.

Step S100: Completion of Layout Data

Figure 12:
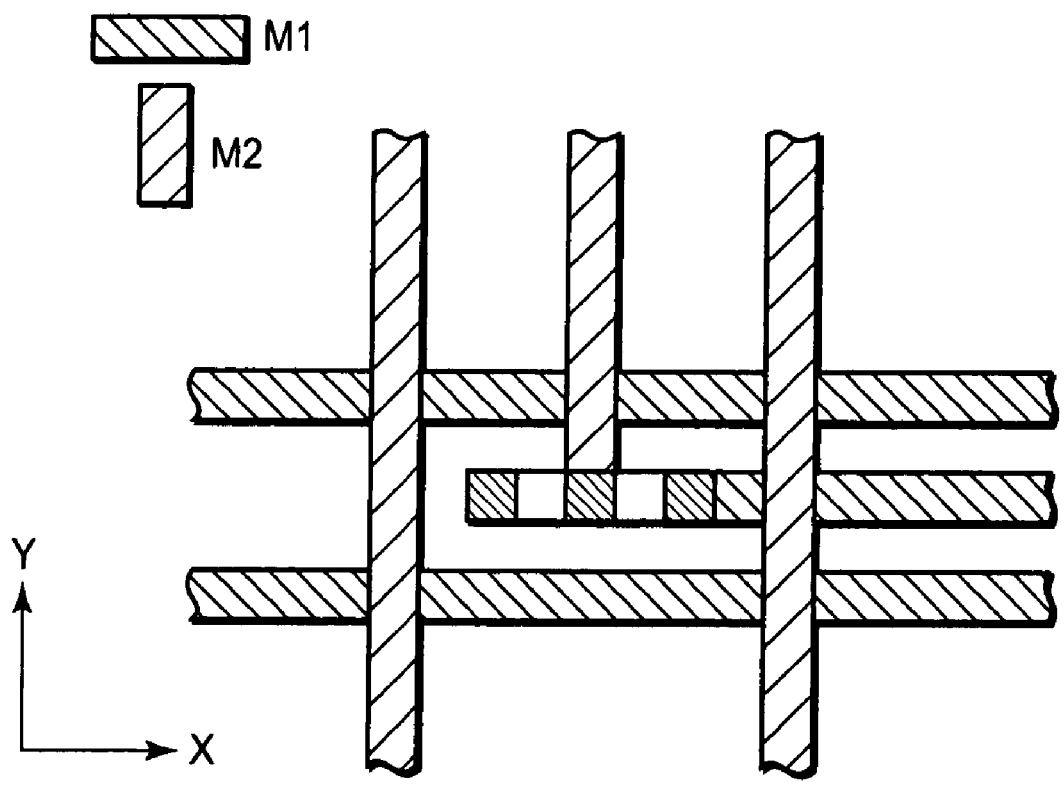
FIG. 12 is a top view showing an example of a triple-cut via in the embodiment of the present invention.

The layout data LAY which show the layout of the design object circuit is created by the layout processing described above. The created layout data LAY is stored in the memory storage 110. Then, as long as it is possible, a redundant via may be further added by the same method as conventional technology. For example, a triple-cut via as shown in FIG. 12 is achieved by adding one redundant via to a double-cut via.

3. Effect

As described above, according to the embodiment, in the detailed wiring processing before layout data completion, a wiring route where a multi-cut via can be used is searched from the beginning. Thus, a layout is performed not using a single-cut via but using a multi-cut via from the beginning. That is, "formation of a redundant via" is not performed. Hence, it is possible to prevent a situation that formation of a redundant via is unrealizable depending on a surrounding wiring situation. In consequence, a usage rate of a multi-cut via improves, and a yield and operational reliability improve.

Furthermore, according to this embodiment, it is possible to place a multi-cut via securely to a location where a malfunction tends to arise. For example, since it is easy in a wiring with a high toggle rate to generate electromigration, it is desirable to apply a multi-cut via to such a wiring preferentially. In conventional technology, since there was a case that addition of a redundant via was not possible depending on a surrounding wiring situation, there was no security that a wiring with a high priority was made into a redundant via. On the other hand, according to this embodiment, the layout using a multi-cut via is performed in order from a wiring with a high priority. In consequence, a multi-cut via is securely applied to a wiring with a high priority. Thus, according to this embodiment, it becomes possible to enhance a yield and operational reliability effectively.

As described above, although the present invention is described in conformity with the above-mentioned embodiments, it is apparent that the present invention is not limited to the above embodiments, but may be modified and changed without departing from the scope and spirit of the invention.

What is claimed is:

1. A layout method of a semiconductor integrated circuit, said method comprising:
   (A) searching a wiring route that layout is possible using a multi-cut via regarding a net not having via information in a net list by using a computer;
   (B) laying out a wiring corresponding to said net on said wiring route with using said multi-cut via; and
   (C) creating layout data of said semiconductor integrated circuit by repeating said (A) and (B) until nets not having via information in said net list are laid out,
   wherein said (B) comprises:
      (B1) changing a layout pattern of an existing multi-cut via into another layout pattern which conforms to design rules when a design rule error arises between a wiring corresponding to said net, and said existing multi-cut via already placed.

2. The layout method of claim 1, wherein said (B) further comprises:
   (B2) reserving a space around said existing multi-cut via by moving an existing wiring already placed when any layout pattern does not exist at said (B1); and
   (B3) laying out a wiring corresponding to said net using said space reserved at said (B2).

3. The layout method of claim 2, wherein in said (B2), wirings are moved in order from an existing wiring with a low toggle rate until said space is reserved.

4. A layout method of a semiconductor integrated circuit, said method comprising:
   (A) searching a wiring route that layout is possible using a multi-cut via regarding a net not having via information in a net list by using a computer;
   (B) laying out a wiring corresponding to said net on said wiring route with using said multi-cut via; and
   (C) creating layout data of said semiconductor integrated circuit by repeating said (A) and (B) until nets not having via information in said net list are laid out,
   wherein said semiconductor integrated circuit includes a first wiring and a second wiring whose toggle rate is lower than that of said first wiring, and said first wiring is laid out before said second wiring.

5. A layout method of a semiconductor integrated circuit, said method comprising:
   (A) searching a wiring route that layout is possible using a multi-cut via regarding a net not having via information in a net list by using a computer;
   (B) laying out a wiring corresponding to said net on said wiring route with using said multi-cut via; and
   (C) creating layout data of said semiconductor integrated circuit by repeating said (A) and (B) until nets not having via information in said net list are laid out,
   wherein said semiconductor integrated circuit includes a clock wiring and the clock wiring has a highest priority among signals in said semiconductor integrated circuit so that said clock wiring is laid out first.

6. A layout method of a semiconductor integrated circuit, said method comprising:

(A) searching a wiring route that layout is possible using a multi-cut via regarding a net not having via information in a net list by using a computer;

(B) laying out a wiring corresponding to said wiring route with using said multi-cut via; and (C) creating layout data of said semiconductor integrated circuit by repeating said (A) and (B) until nets not having via information in said net list are laid out, wherein said semiconductor integrated circuit includes a clock wiring and a critical signal wiring except said clock wiring, and said clock wiring is laid out first, and said critical signal wiring is next laid out.

7. The layout method of claim 5, wherein said semiconductor integrated circuit further includes a first wiring and a second wiring whose toggle rate is lower than that of said first wiring, and after said clock wiring is laid out, said first wiring is laid out before said second wiring.

8. The layout method of claim 4, further comprising:

(X) reading a toggle rate file which shows each toggle rate of two or more nets in said net list, wherein said two or more nets include a first net corresponding to said first wiring, and a second net corresponding to said second wiring, and in said toggle rate file, said first net is associated with a first toggle rate, and said second net is associated with a second toggle rate lower than that of said first toggle rate.

9. A layout method of a semiconductor integrated circuit, said method comprising:

(A) searching a wiring route that layout is possible using a multi-cut via reaarding a net not having via information in a net list by using a computer;

(B) laying out a wiring corresponding to said net on said wiring route with using said multi-cut via;

(C) creating layout data of said semiconductor integrated circuit by repeating said (A) and (B) until nets not having via information in said net list are laid out; and (D) reading a pattern file which defines two or more layout patterns regarding a multi-cut via, wherein a multi-cut via of a pattern which conforms to design rules is selected out of two or more layout patterns at said (A).

10. A non-transitory computer-readable storage medium which records a program which makes a computer execute an automatic layout method of a semiconductor integrated circuit the method comprising:

(A) searching a wiring route that layout is possible using a multi-cut via regarding a net not having via information in a net list;

(B) laving out a wiring corresponding to said net on said wiring route with using said multi-cut via; and (C) creating layout data of said semiconductor integrated circuit by repeating said (A) and (B) until nets not having via information in said net list are laid out, wherein said (B) comprises:

(B1) changing a layout pattern of an existing multi-cut via into another layout pattern which conforms to design rules when a design rule error arises between a wiring corresponding to said net, and said existing multi-cut via already placed.

11. The computer-readable storage medium of claim 10, wherein said (B) further comprises:

(B2) reserving a space around said existing multi-cut via by moving an existing wiring already placed when any layout pattern does not exist at said (B1); and (B3) laying out a wiring corresponding to said net using said space reserved at said (B2).

12. The computer-readable storage medium of claim 11, wherein, at said (B2), wirings are moved in order from an existing wiring with a low toggle rate until said space is reserved.

13. A non-transitory computer-readable storage medium which records a program which makes a computer execute an automatic layout method of a semiconductor integrated circuit, the method comprising:

(A) searching a wiring route that layout is possible using a multi-cut via regarding a net not having via information in a net list;

(B) laying out a wiring corresponding to said net on said wiring route with using said multi-cut via; and (C) creating layout data of said semiconductor integrated circuit by repeating said (A) and (B) until nets not having via information in said net list are laid out, wherein said semiconductor integrated circuit includes a first wiring and a second wiring whose toggle rate is lower than that of said first wiring, and said first wiring is laid out before said second wiring.

14. A non-transitory computer-readable storage medium which records a program which makes a computer execute an automatic layout method of a semiconductor integrated circuit, the method comprising:

(A) searching a wiring route that layout is possible using a multi-cut via regarding a net not having via information in a net list;

(B) laying out a wiring corresponding to said net on said wiring route with using said multi-cut via; and (C) creating layout data of said semiconductor integrated circuit by repeating said (A) and (B) until nets not having via information in said net list are laid out, wherein said semiconductor integrated circuit includes a clock wiring and the clock wiring has a highest priority among signals in said semiconductor integrated circuit so that said clock wiring is laid out first.

15. A non-transitory computer-readable storage medium which records a program which makes a computer execute an automatic layout method of a semiconductor integrated circuit, the method comprising:

(A) searching a wiring route that layout is possible using a multi-cut via regarding a net not having via information in a net list;

(B) laying out a wiring corresponding to said net on said wiring route with using said multi-cut via; and (C) creating layout data of said semiconductor integrated circuit by repeating said (A) and (B) until nets not having via information in said net list are laid out, wherein said semiconductor integrated circuit includes a clock wiring and a critical signal wiring except said clock wiring, and said clock wiring is laid out first, and said critical signal wiring is next laid out.

16. The computer-readable storage medium of claim 14, wherein said semiconductor integrated circuit further includes a first wiring and a second wiring whose toggle rate is lower than that of said first wiring, and after said clock wiring is laid out, said first wiring is laid out before said second wiring.

17. The computer-readable storage medium of claim 13, further comprising:

(X) reading a toggle rate file which shows each toggle rate of two or more nets in said net list, wherein said two or more nets include a first net corresponding to said first wiring, and a second net corresponding to said second wiring, and in said toggle rate file, said first net is associated with a first toggle rate, and said second net is associated with a second toggle rate lower than that of said first toggle rate.

18. A non-transitory computer-readable storage medium which records a program which makes a computer execute an automatic layout method of a semiconductor integrated circuit, the method comprising:
   (A) searching a wiring route that layout is possible using a multi-cut via regarding a net not having via information in a net list;
   (B) laying out a wiring corresponding to said net on said wiring route with using said multi-cut via;
   (C) creating layout data of said semiconductor integrated circuit by repeating said (A) and (B) until nets not having via information in said net list are laid out; and
   (D) reading a pattern file which defines two or more layout patterns regarding a multi-cut via, wherein a multi-cut via of a pattern which conforms to design rules is selected out of said two or more layout patterns at said (A).

19. A layout method of a semiconductor integrated circuit, said method comprising:
   (A) searching a wiring route that layout is possible using a multi-cut via regarding a net not having via information in a net list by using a computer,
   (B) laying out a wiring corresponding to said pet on said wiring route with using said multi-cut via; and
   (C) creating layout data of said semiconductor integrated circuit by repeating said (A) and (B) until nets not having via information in said net, list are laid out,
   wherein said (A) includes:
      (A1) determining a first grid point, the first grid point being a point to connect a lower wiring layer and an upper wiring layer for said net not having via information; and
      (A2) determining that said multi-cut via is usable when a second grid point adjacent to said first grid point is available to place wiring on both said lower wiring layer and said upper wiring layer.

20. The layout method according to claim 19, wherein said multi-cut via comprises a via pattern which comprises a first via, a second via and wirings to connect said first via to said second via on both said lower wiring layer and said upper wiring layer, and wherein said via pattern is placed in accordance with said first grid point and said second grid point.

21. The layout method according to claim 20, wherein said (A1) determines a third grid point when a design-rule error occurs, and
   wherein said via pattern is placed in accordance with said first grid point and said third grid point.

22. A non-transitory computer-readable storage medium which records a program which makes a computer execute an automatic layout method of a semiconductor integrated circuit, the method comprising:
   (A) searching a wiring route that layout is possible using a multi-cut via regarding a net not having via information in a net list;
   (B) laying out a wiring corresponding to said net on said wiring route with using said multi-cut via; and
   (C) creating layout data of said semiconductor integrated circuit by repeating said (A) and (B) until nets not having via information in said net list are laid out,
   wherein said (A) includes:
      (A1) determining a first grid point, the first grid point being a point to connect a lower wiring layer and an upper wiring layer for said net not having via information; and
      (A2) determining that said multi-cut via is usable when a second grid point adjacent to said first grid point is available to place wiring on both said lower wiring layer and said upper wiring layer.

23. The computer readable storage medium of claim 22, wherein said multi-cut via comprises a via pattern which comprises a first via, a second via and wirings to connect said first via to said second via on both said lower wiring layer and said upper wiring layer, and
   wherein said via pattern is placed in accordance with said first grid point and said second grid point.

24. The computer-readable storage medium of claim 23, wherein said (A1) determines a third grid point when a design-rule error occurs, and
   wherein said via pattern is placed in accordance with said first grid point and said third grid point.

* * * * *